(12) United States Patent
Vanfleteren et al.

(10) Patent No.: US 7,487,587 B2
(45) Date of Patent: Feb. 10, 2009

(54) METHODS OF PRODUCING A COMPOSITE SUBSTRATE

(75) Inventors: Jan Vanfleteren, Gentbrugge (BE);
Dominique Brosteaux, Deinze (BE);
Fabrice Axisa, Sacierges-Saint-Martin (FR)

(73) Assignees: Interuniversitair Microelektronica Centrum vzw (IMEC), Leuven (BE);
Universiteit Gent, Ghent (BE)

( * ) Notice: Subject to any disclaimer, the term of this patent is extended or adjusted under 35 U.S.C. 154(b) by 65 days.

(21) Appl. No.: 11/387,446

(22) Filed: Mar. 22, 2006

(65) Prior Publication Data
US 2006/0231288 A1 Oct. 19, 2006

(30) Foreign Application Priority Data
Mar. 22, 2005 (GB) .................. 0505826.8

(51) Int. Cl.
*H05K 3/02* (2006.01)
*H01R 43/00* (2006.01)
(52) U.S. Cl. ............... 29/846; 29/825; 29/830; 427/96.1

(58) Field of Classification Search ............ 29/825, 29/830, 846; 427/96.1
See application file for complete search history.

(56) References Cited

U.S. PATENT DOCUMENTS

| 5,147,519 | A | 9/1992 | Legge | |
|---|---|---|---|---|
| 7,056,759 | B2 * | 6/2006 | Przybyla et al. | 438/53 |
| 2004/0192082 | A1 * | 9/2004 | Wagner et al. | 439/67 |
| 2004/0243204 | A1 * | 12/2004 | Maghribi et al. | 607/115 |

OTHER PUBLICATIONS

Gray et al., High-conductivity elastomeric electronics, *Adv. Mater.*, 16(5):393-397 (2004).

* cited by examiner

*Primary Examiner*—C. J Arbes
(74) *Attorney, Agent, or Firm*—Knobbe Martens Olson & Bear LLP

(57) ABSTRACT

Methods of producing a composite substrate and devices made by the methods are disclosed. One of the methods comprises providing a flexible sacrificial layer, producing one or more patterned conducting layers on the flexible sacrificial layer, bending the sacrificial layer into a predetermined shape, providing a stretchable and/or flexible material on top of and in between features of the one or more patterned layers.

29 Claims, 4 Drawing Sheets

METHODS OF PRODUCING A COMPOSITE SUBSTRATE

BACKGROUND OF THE INVENTION

1. Field of the Invention

The present invention relates to composite substrates and methods of producing composite substrates, in particular for use in the field of flexible electronics.

2. Description of the Related Technology

It is at least doubtful that the production of metallic conductors with low resistivity of e.g. 5 mΩ/square (meaning e.g. a Cu thickness of about 4 µm) onto a stretchable and/or flexible material (e.g. silicone) will be possible with an adhesion or a sufficiently good adhesion of the conductor to the stretchable and/or flexible substrate.

Solidifying overmould material may be used, resulting in a rigid plastic part with embedded conductors. In some cases a sacrificial layer may be used as a 70 µm thick Cu foil.

If the applied conductor pattern is a meander like structure (as shown for instance in "High-Conductivity Elastomeric Electronics", Darren S. Gray et al., Advanced Materials 2004, 16, No. 5, March 5, p 393-p 397) it is believed that in this way thick (several microns) highly conductive (5 mΩ per square) fine pitch (40 µm or lower) stretchable conductors can be made.

The use of flexible and stretchable substrates and composite structures offer a lot of advantages when compared to rigid, not flexible and/or not stretchable substrates and structures, which are known to a person of ordinary skill. Various methods for producing stretchable electronic circuits have been mentioned (US patent application 2004 0243204 A1, and WO 2004 095536 A2=US 2004 0192082). R. Legge (U.S. Pat. No. 5,147,519) described a method of manufacturing elastomers containing fine line conductors. R. Legge uses a flat rigid material as sacrificial substrate.

SUMMARY OF CERTAIN INVENTIVE ASPECTS

It is an aim of certain aspects of the invention to provide a method for producing devices and structures, wherein conductors or semiconductor material is embedded, which alleviates or avoids the problems of the prior art. Embedding conductors into a stretchable and/or flexible material is interesting for many applications. Adhesion of these conductors into the stretchable and/or flexible material during bending or stretching is often problematic, especially when the conductor is not completely surrounded with the stretchable and/or flexible material for contacting purposes.

One inventive aspect is a method to partially embed a patterned conductor into a stretchable and/or flexible material. The patterned conductors are anchored into this stretchable and/or flexible material in a very reliable way. By using a flexible substrate, it is possible to bend the sacrificial layer with the conductors into a desired shape prior to depositing the flexible and/or stretchable material. An advantage of bending prior to depositing the flexible and/or stretchable material is a reduced risk that the conducting material jumps out of the surrounding flexible and/or stretchable material during bending. Another advantage is that, when the flexible and/or stretchable material is deposited after bending the substrate with conductors in a predefined shape, this shape will be (at least partially) maintained after removing the sacrificial substrate.

Furthermore, by the appropriate choice of the shape of the conductors, better anchoring of the conductors into the flexible and/or stretchable material can be achieved. Also an extra etch step before applying the flexible and/or stretchable material may improve the anchoring of the conductors into the flexible and/or stretchable material.

Certain aspects of the invention can be found in the independent and dependent claims. Features from the dependent claims may be combined with features of the independent claims and with features of other dependent claims.

In a first aspect of the invention a method for producing a composite substrate is presented, comprising:
  providing a flexible sacrificial layer.
  providing a patterned conducting layer or stack of conducting layers on the flexible sacrificial layer. This patterned layer or stack of layers comprises patterned features.
  bending the flexible sacrificial layer including patterned features into a predefined shape.
  deposing a stretchable and/or flexible material on top of and in between these patterned features while the sacrificial layer is bent.
  removing the sacrificial layer.

Making the sacrificial layer flexible makes it possible to bend the sacrificial layer with the conductors into a desired shape prior to depositing the flexible and/or stretchable material. Otherwise bending the conductors and surrounding material after removing the sacrificial substrate increases the risk that the conductors jump out of the surrounding material. Furthermore, as the surrounding is stretchable and/or flexible, the adhesion of the conductors into this material may become problematic.

In an embodiment of this invention the shape of the patterned features is chosen such that they are anchored into the stretchable and/or flexible material. In another embodiment a choice of the shape of the patterned features is represented, i.e. a shape with sloped sidewalls. The direction of the slope is chosen such the patterned features are anchored into the stretchable and/or flexible material. Another choice for the shape of patterned features is a substantially trapezoidal shape.

In another embodiment an extra etch step is included before adding the stretchable and/or flexible material for better anchoring the patterned features. In this approach an extra etch step is included after producing the patterned features, removing part of the sacrificial layer also partially underneath the patterned features. Thereby gaps are created underneath the patterned features. When applying the stretchable and/or flexible material, the gaps are filled with the stretchable and/or flexible material. After removing the sacrificial substrate, the patterned features are anchored in the stretchable and/or flexible material.

In another embodiment, the patterned features are optically conducting or thermally conducting or electrically conducting. In another embodiment, the patterned features comprise a metal or a semiconductor material.

In another embodiment the sacrificial layer comprises sublayers. In an embodiment, at least one sacrificial sub-layer together with the sacrificial layers is peeled off the composite substrate comprising the patterned features and stretchable and/or flexible material. In another embodiment, the sacrificial sublayers are etched off one-by-one selectively with respect to the next sublayer.

In another embodiment, the sacrificial layer is conducting. In this case patterning the conducting layer or stack of layers may comprise:
  applying a resist layer
  patterning the resist layer
  electroplating the conducting layer or stack of layers
  removing the resist layer In an embodiment the stretchable and/or flexible material is deposited with a technique selected from the group consisting of moulding, curtain coating, dispensing, dipping, and spincoating.

In another embodiment components are included in the composite substrate. These components are in electrical or optical contact with the patterned features. In that case, the patterned features may form an interconnect section between the components. It may be necessary to apply an underfill material in substantially the whole of the area confined by the patterned features, the sacrificial layer, and the components.

After removing the sacrificial layer, also a second set of components can be provided at the side where the sacrificial layer is removed. In that case a second layer of stretchable and/or flexible material can be deposited surrounding this second set of components. It may be necessary to do a surface treatment prior to depositing this second layer of stretchable and/or flexible material. This surface treatment may be a plasma treatment. For contacting this second set of components it may be necessary to pattern this second layer of stretchable and/or flexible material.

To protect parts of the composite substrate, a local stiffener may be used. This local stiffener can be rigid or flexible. This local stiffener can also be a locally increased thickness of the stretchable material and/or flexible. This locally increased thickness can be achieved by moulding techniques.

In a second aspect of the invention a composite substrate is proposed, comprising a stretchable and/or flexible material bent in a predetermined shape and patterned features embedded in the stretchable and/or flexible material when bent. These patterned features comprise a patterned conducting layer or stack of conducting layers. Optionally at least part these patterned features are free of (or not covered by) stretchable and/or flexible material.

In an embodiment of the second aspect, the patterned features have shapes such that they are anchored into the stretchable and/or flexible material. In another embodiment they have sloped sidewalls. The slope is chosen such that these patterned features are anchored into the stretchable and/or flexible material. A good choice for the shape of the patterned features is a substantially trapezoidal shape.

In another embodiment of the second aspect, the patterned structures are optically conducting or thermally conducting or electrically conducting. In another embodiment, the patterned features comprise a metal or a semiconductor material.

In another embodiment of the second aspect, components are introduced into the composite substrate. These components can be in electrical or optical contact with these patterned features. These patterned features can form an interconnect section between these components. It may be necessary to include an underfill material in substantially the whole of the area confined by the patterned features, the sacrificial layer, and the components. In another embodiment, components can be introduced at the side where the patterned features are free of the stretchable and/or flexible material. In that case, a second layer of stretchable and/or flexible material can be deposited on top and in between these components. To contact these components holes need to be made in this second layer of stretchable and/or flexible material.

To protect parts of the composite substrate a local stiffener can be used. This local stiffener can be rigid or flexible. This local stiffener can be a locally increased thickness of the flexible and/or stretchable material.

The characteristics, features, and advantages of certain embodiments will be clarified in the following detailed description in combination with the drawings, which illustrate the principles of the invention. The description is given as an example only, without limiting the scope of the invention.

DETAILED DESCRIPTION OF CERTAIN INVENTIVE EMBODIMENTS

Figure 1:
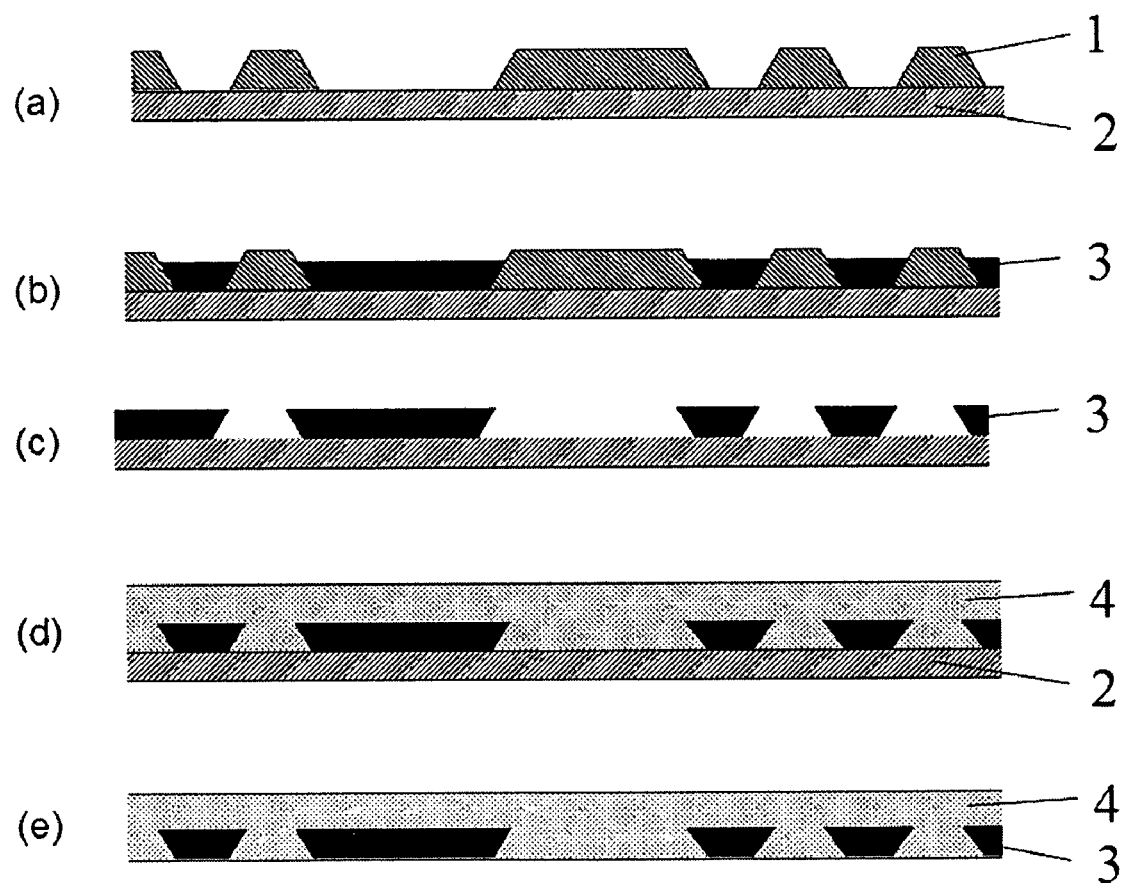
FIG. 1 illustrates a method of making a composite substrate, according to one embodiment.

Certain embodiments of the present invention will be described with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and that the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present embodiments, the only relevant components of the device are A and B.

It should be understood that the embodiments above are only a limited selection of all possible embodiments. Many other combinations and locations of semi-conduction layers, additional layers, insulating layer and first and second electrode are possible.

For the purpose of the present description a flexible substrate is a substrate which is flexible, which can bow or bend under certain influences as forces as for instance physical or mechanical force, without hereby losing its essential functionalities. The flexible substrate may also be not self-supporting when an elongate strip of the substrate is held at one edge only, so it may bend under the influence of gravity.

For the purpose of the present description a stretchable substrate is a substrate which is stretchable, which can stretch under certain influences as forces as for instance physical or mechanical force, without hereby losing its essential functionalities.

FIG. 1 illustrates a method of making a composite substrate, according to one embodiment. In FIG. 1.*a*, a resist layer (1) is deposited on a sacrificial metal layer or substrate (2) and patterned. In FIG. 1.*b* a metal layer or metal stack (3) is electroplated on the substrate (2). In FIG. 1.*c* remaining patterned features (3) on the sacrificial substrate (2) are represented after removing the resist layer. In FIG. 1.*d* a stretchable and/or flexible material (4) is deposited on top and in between these patterned features. In FIG. 1.*e* the sacrificial layer is removed.

Figure 2:
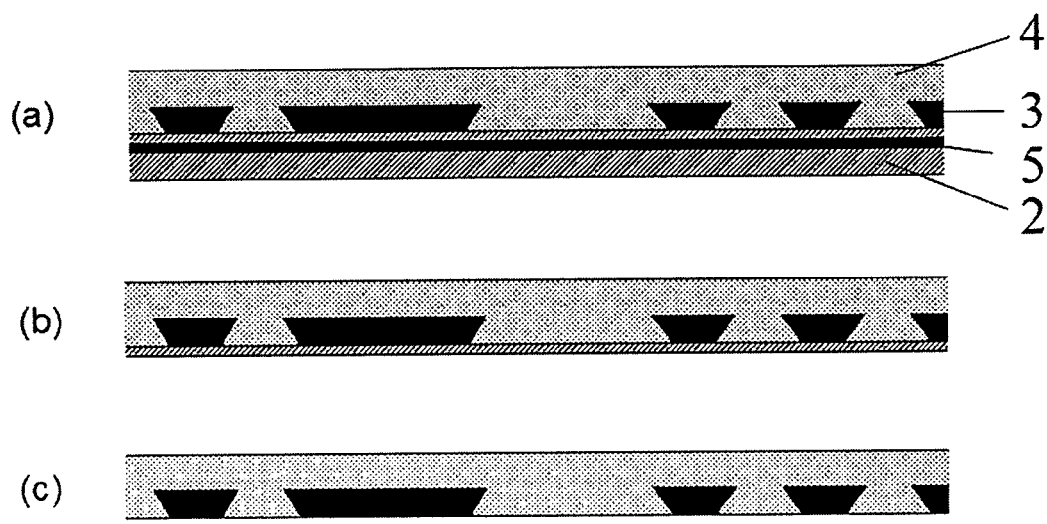
FIG. 2 illustrates a method of making a composite substrate, according to another embodiment.

FIG. 2 illustrates a method of making a composite substrate, according to another embodiment. In FIG. 2.*a* the sacrificial layer comprises different sublayers including a release layer (5). At the end of the process first the thick carrier layer with release layer can simply mechanically be peeled off (FIG. 2.*b*), followed by removing the layer in contact with the stretchable and/or flexible material (FIG. 2.*c*).

Figure 3:
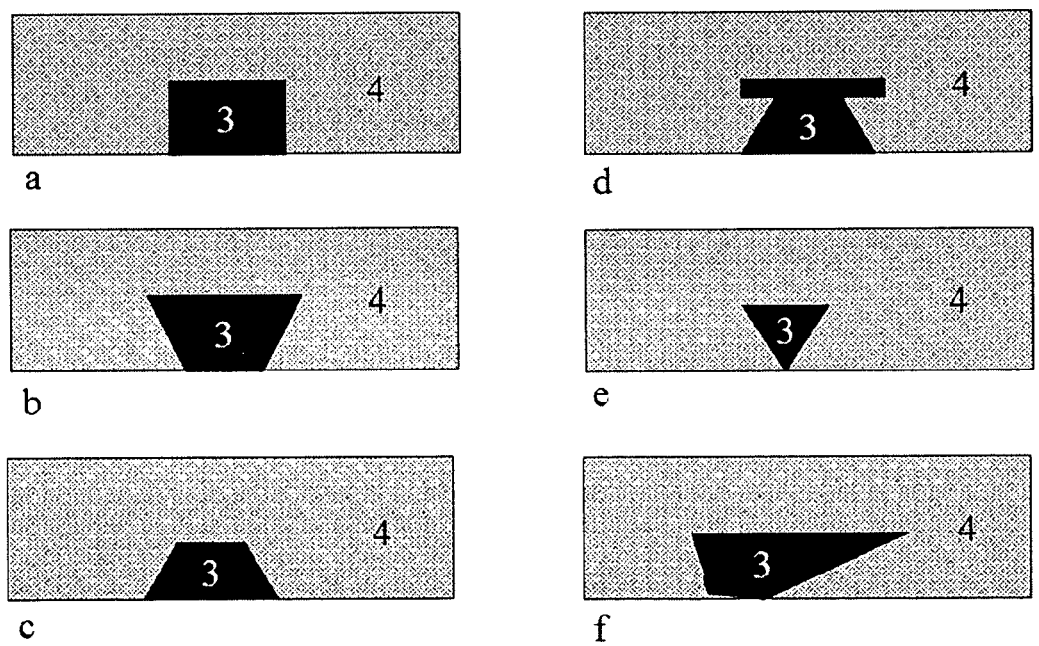
FIG. 3 illustrates certain shapes for the patterned conducting layer or stack of conducting layers, according to one embodiment.

FIG. 3 illustrates certain shapes for the patterned conducting layer or stack of conducting layers, according to one embodiment. Anchoring of the features into the stretchable and/or flexible material is achieved in FIGS. 3.*b*, 3.*d*, 3.*e*, and 3.*f*. FIG. 3*c* may have a lesser degree of adhesion, which may be solved by other means as for instance by choosing the right material combination—flexible and/or stretchable material and the patterned conducting layer material. Anchor structures may be provided in order to provide a good adhesion to the flexible and/or stretchable material film.

Figure 4:
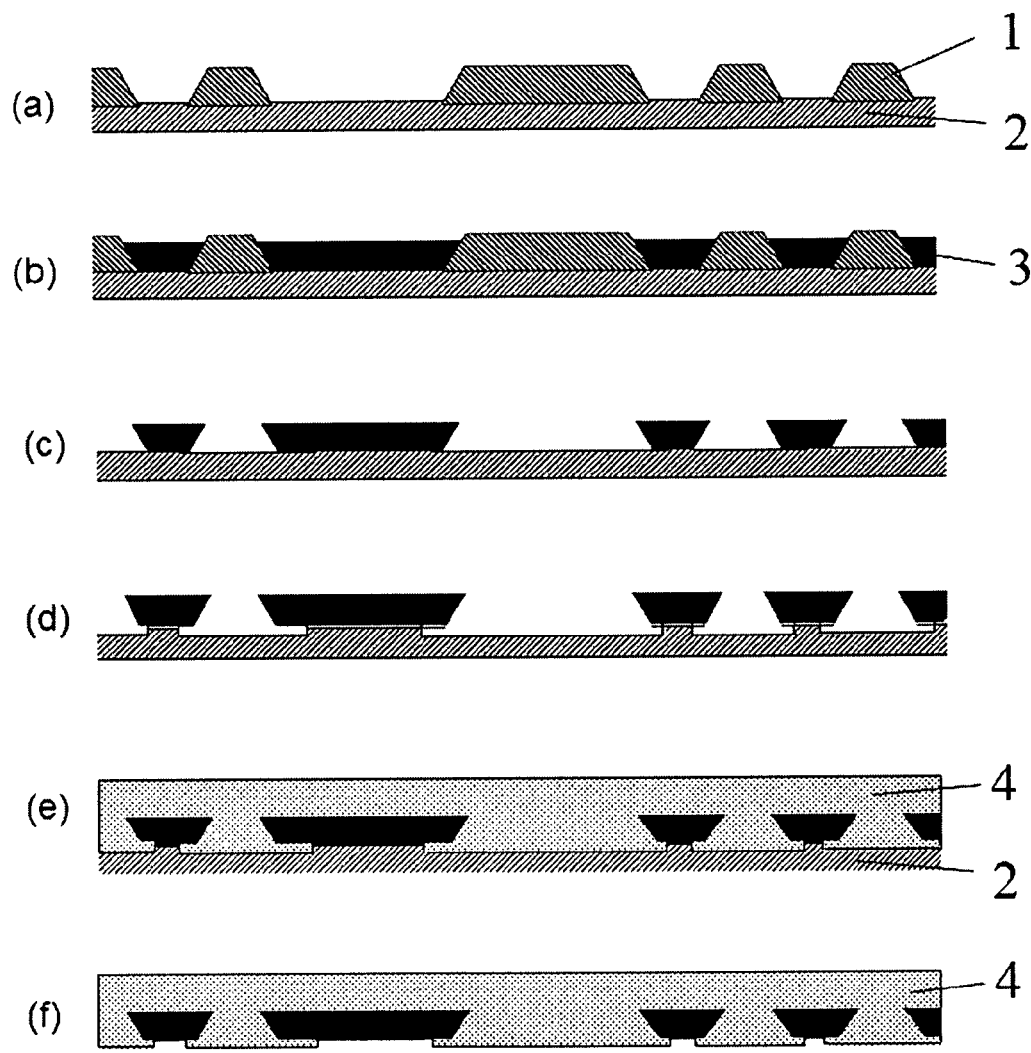
FIG. 4 illustrates anchoring of the conductor using an extra etch step after patterning the conductor, according to one embodiment.

FIG. 4 illustrates anchoring of the conductor using an extra etch step after patterning the conductor, according to one embodiment. The patterning of the conductor is illustrated in FIGS. 4.*a*, 4.*b*, and 4.*c*. In 4.*d* underetch or undercut is obtained by an extra etch step by etching part of the sacrificial layer. In FIG. 4.*e* the gap underneath the patterned conductor is filled by the stretchable and/or flexible material. FIG. 4.*f* illustrates the anchoring of the patterned conductor into the stretchable and/or flexible material after removing the sacrificial substrate.

Figure 5:
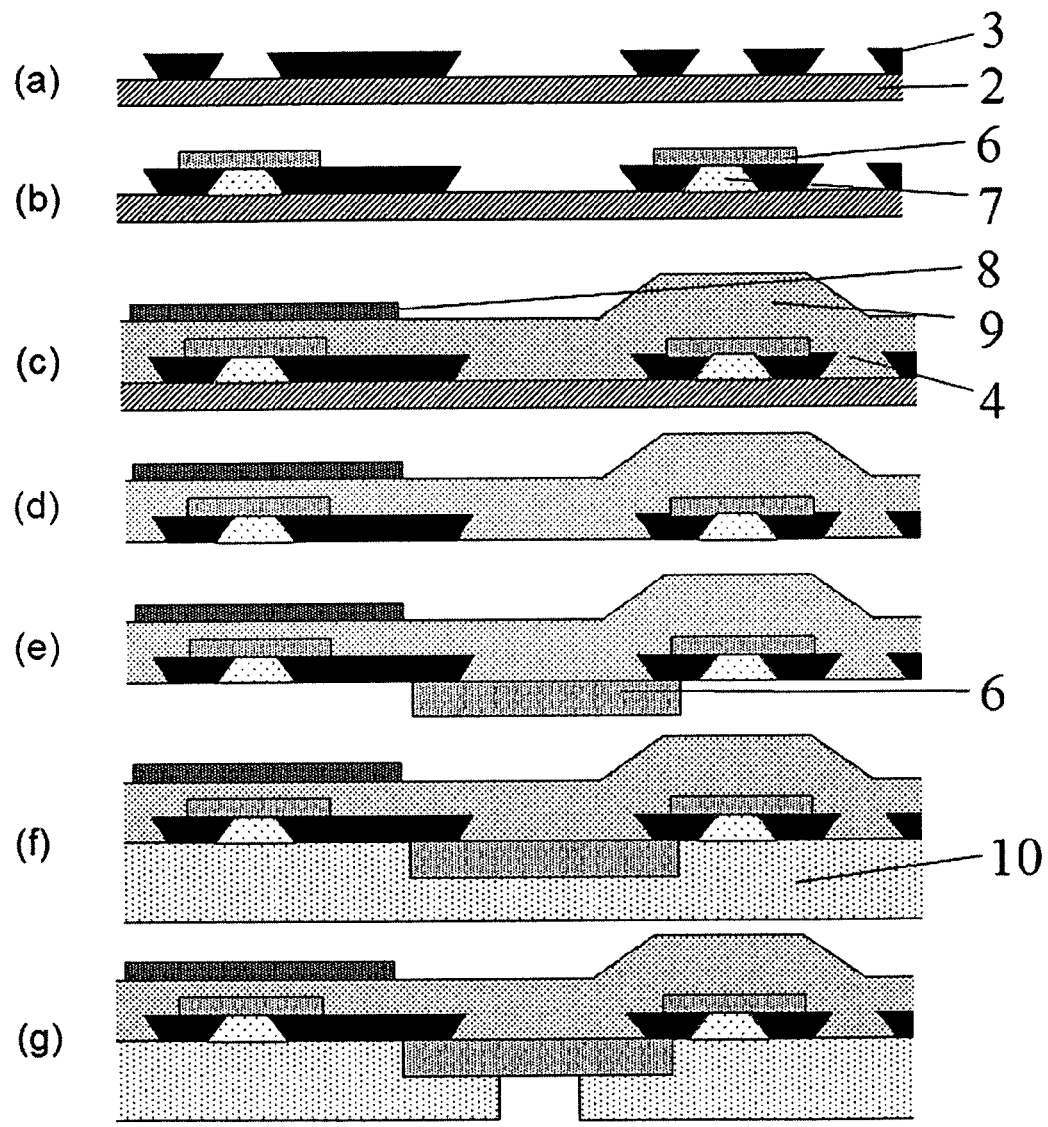
FIG. 5 illustrates a method of making a composite substrate, according to another embodiment.

FIG. 5 illustrates a method of making a composite substrate, according to another embodiment, wherein components are incorporated or imbedded in a flexible and/or stretchable structure or device. The exemplary embodiment allows stretchable circuits with embedded metal conductors. On patterned features (number (3) in FIG. 5.*a*), extra components can be added (number (6) in FIG. 5.*b*). Underfill of the components can be done (number (7) in FIG. 5.*b*). Consequently, stretchable and/or flexible material is provided on top of and in between the patterned features (number (4) in FIG. 5.*c*). A local stiffener can be added to protect the extra components to against excess mechanical stress during stretching (numbers (8) and (9) in FIG. 5.*c*). Consequently, the sacrificial layer is removed (FIG. 5.*d*). Eventually a second set of components can be introduced at the side where the sacrificial layer is removed (number (6) in FIG. 5.*e*). Optionally, this second set of components can be covered with the same or another stretchable and/or flexible material (number (10) in FIG. 5.*f*). For contacting this second set of components, holes need to be introduced into the latter stretchable and/or flexible material (FIG. 5.*g*).

Different elements are depicted in the drawings. Although other elements may be present, those have not been depicted to simplify the figures. The same reference numbers in different pictures refer to the same elements. Some reference signs and their description:
- (1) patterned resist layer
- (2) sacrificial layer, which can be a stack of sacrificial sublayers
- (3) patterned conducting layer or stack of conducting layers
- (4) stretchable and/or flexible material
- (5) sacrificial sublayer
- (6) components
- (7) underfill, adhesive material
- (8) local stiffener
- (9) locally thicker stretchable or flexible material
- (10) second stretchable and/or flexible material.

A substrate can comprise metal lines, interconnect lines, electronic components, chips, etc. All the constituents together form a composite substrate. Such a composite substrate is flexible if it has at least some flexibility in at least part of it. Such a composite substrate is stretchable if it is stretchable in at least part of it.

As the method and the device made by this method are closely related, they will be described together.

A method for producing a composite substrate is disclosed, comprising:
providing a flexible sacrificial layer or substrate;
producing a patterned conducting layer or stack of conducting layers on this sacrificial layer, the patterned layer or stack of layers comprising patterned features;
providing a stretchable and/or flexible material on top of and in between the patterned features; and
removing the sacrificial layer.

An example of processing steps according to embodiments of the present invention is represented in FIG. 1. In this embodiment a conducting sacrificial substrate was selected to illustrate the idea. First, a resist layer (1) is deposited on a sacrificial metal layer or substrate (2) and patterned (FIG. 1.*a*). Consequently a metal layer or metal stack (3) is electroplated on this substrate (FIG. 1.*b*). After removing the resist layer patterned features (3) remain on the sacrificial substrate (2) (FIG. 1.*c*). Consequently a stretchable and/or flexible material (number (4) in FIG. 1.*d*) is deposited on top and in between these patterned features. Finally, the sacrificial layer is removed (FIG. 1.*e*). Using this method a composite substrate is made comprising a stretchable and/or flexible material and patterned features embedded in this stretchable and/or flexible material. At least part of the patterned features is not covered by the stretchable and/or flexible material and the patterned features comprise a patterned conducting layer or stack of conducting layers.

In this embodiment the sacrificial layer is flexible and not stretchable. Prior to depositing the stretchable and/or flexible material, the substrate can be bended together with the patterned features into a desired shape. This can be done after step (c) in FIG. 1, but before step (d).

An advantage of bending prior to depositing the flexible and/or stretchable material is that, when the flexible and/or stretchable material is deposited after bending the substrate with conductors in a predefined shape, the composite substrate maintains more or less its shape after removing the sacrificial substrate.

When bending the composite substrate after providing the stretchable and/or flexible material, the patterned material might jump out of the stretchable and/or flexible material. Bending the substrate into the desired shape prior to depositing the stretchable and/or flexible material reduces the risk that the patterned material releases from the stretchable and/or flexible material.

The choice of the materials of the sacrificial layer depends on several issues, for example the deposition technique of the conducting material, bending of the substrate, etc.

In certain embodiments the sacrificial layer can be conducting, i.e. it comprises a metal or semiconductor material. Conducting sacrificial layers allow electroplating in a further step (as illustrated in FIG. 1.b).

If no electroplating is used for conductor deposition, also a non-conducting sacrificial layer can be used, which preferably still allows removal at the end of the process, if component assembly at the backside is to be performed.

In certain embodiments of the present invention the sacrificial layer can comprise sublayers, i.e. the sacrificial layer comprises sub-sacrificial layers. This is illustrated in FIG. 2. Each of those sub-sacrificial layers can have certain functionality.

After depositing all materials, the sacrificial metal or other material needs to be removed e.g. by wet etching (FIG. 1.e). The sacrificial material can be removed also by dry etching: plasma etching or reactive ion etching (RIE). This can mean long etching times, or shorter etching times with very aggressive etchants, which can harm, influence or damage the flexible and/or stretchable material.

A sacrificial sublayer can be applied (FIG. 2.a), which can for instance be peeled off together with the underlying layers, also called a release layer 5 (FIG. 2.b). This can for instance be achieved by choosing an appropriate stack of sacrificial sublayers. An advantage of such a type of sacrificial sublayer is that, although a sufficiently thick sacrificial layer may be required during processing and handling, such sacrificial layer needs to be removed in the end. Peeling off of the biggest part of this sacrificial layer (e.g. a series of sublayers can be peeled off), reduces its thickness, which allows shorter overall thinning or removal-times, and allows the use of a less aggressive etchants in a very last phase, whereby only a thin layer of sacrificial material needs to be removed (FIG. 2.c). This reduces the possibly negative influences on the flexible and/or stretchable material and on the patterned conducting layers.

For plating a thick metal layer such as a Cu layer might be used as a sacrificial layer. An alternative to avoid etching a thick Cu layer at the end of the process, in certain embodiments of the present invention, a sacrificial metal layer, comprising for instance a thin conducting layer on top of a thicker carrier can be used with a release layer in between (FIG. 2.a). Such a material is available from e.g. Mitsui (Japan) or Circuit Foil (Luxemburg). The product of Circuit Foil ("Thin Copper") consists of 3 μm of Cu on top of 35 μm Cu with a Cr release layer in between. At the end of the process first the thick carrier layer with release layer can simply mechanically be peeled off (FIG. 2.b), followed by the wet etching of 3 μm of Cu only, resulting in final result (FIG. 2.c).

In another embodiment, sublayers can be used to etch off different layers one-by-one selectively to the following layer. As a consequence, the sublayer contacting the stretchable and/or flexible material with patterned features is exposed to a less aggressive etchant or a reduced etching time. An example is a Cu base layer of ~35 μm in combination with a thin Sn (tin) layer with a thin Cu-layer on top. After eventually bending the substrate together with the patterned Cu-conductor, the stretchable and/or flexible material is deposited. Consequently the bottom Cu layer of ~35 μm can be etched off selectively to Sn. Consequently, Sn can be removed selectively to Cu and, finally the Cu can be removed.

The flexible metal foil can be replaced by flexible isolating foil (e.g. polyimide foil) with a metal layer on top such as a Cu layer on top. For electroplating at least a uniform thin electrically conducting layer (e.g. 1 μm of Cu) is preferably present onto which electroplating is possible. The total thickness of the sacrificial layer is preferable at least 20 μm for handling reasons: it is difficult to handle ultrathin substrates. However use of sublayers in the sacrificial layer may make the final removal process more difficult (unless peeling off is possible, as proposed by some embodiments of the present invention). The use of polyimde foil with thin Cu as sacrificial layer is not practical for this reason: polyimde cannot be peeled off the Cu and is very difficult to remove by wet etching or other etching techniques.

The final choice for the type of sacrificial layer will depend mainly on the resulting cost: versions with a release layer have a higher materials cost but allow faster processing with less chemicals.

On this sacrificial layer, a patterned conducting layer or stack of conducting layers, comprising patterned features is provided. This can be done in different ways.

In case the sacrificial substrate is metal or comprises a metallic top layer, the patterned conducting layer or stack of layers can be formed by electroplating. This is illustrated in FIGS. 1.a to 1.c. First a photoresist is applied on a uniform sacrificial metal layer (e.g. a Cu flexible foil) and patterned e.g. by photolithography (FIG. 1.a). To further reduce the cost, and especially for more coarse pitch applications (>100 μm) printed resist patterns instead of photolithographic patterning can be used. Instead of photolithography patterned resist also a directly printed resist can be used applied by stencil or screen printing, or flexo, gravure or offset printing. Any material which can be removed after applying the conducting layers can be used. In a next step a metal or metal stack (e.g. Au/Ni/Cu) or conducting layer or stack of layers is electroplated onto the exposed metal (pattern plating) (FIG. 1.b). Any other type of conductors or conductor stacks can be used, e,g, Pt, Al, Ag, Au/Ni/Cu/Ni/Au, etc. Finally the photoresist is removed (FIG. 1.c).

Instead of electroplating other deposition techniques can be used, e,g, sputtering, thermal and e-gun evaporation, electroless (also called chemical) plating. Several of these deposition techniques can also be used on insulating substrates. Patterning of these layers can be done in different ways for example by lift-off techniques or by patterning the layer using lithography and dry and/or wet etching techniques.

In certain embodiments the patterned conducting layer or stack of layers comprises a metal or a semiconductor material. Such conducting layers can serve well for electrical conduction. Electrical conduction can be used for interconnect purposes.

In certain embodiments the patterned conducting layer can be chosen such that it is optically conducting (i.e. conducting electromagnetic radiation as light) or thermally conducting (conducting heat).

The flexible and/or stretchable material can then by applied on top and in between these patterned features. This can be done by spin coating or spinning, eventually followed by a curing step. Instead of spin coating also moulding techniques, curtain coating, dispensing or dipping can be used.

In certain embodiments the result is a stretchable substrate with embedded conductors. If flexible material is applied which is not stretchable the result will be a flexible substrate with embedded components (but not stretchable).

A stretchable material (e.g. silicone by spinning) can be applied, followed by curing (step (c)). Instead of silicone any stretchable material can be used: latex, polyurethane, all kinds of rubbers like NBR (nitrile butadiene rubber), thermoplastic elastomers (TPE), TPEs are grouped into major families based on polyolefin (TPE-O), polyester (TPE-E), polyurethane (TPE-U), polyamide (TPE-A), and styrene (TPE-S). The soft stretchable material can also be a non-polar rubber, such as styrene butadiene rubber (SBR), ethylene propylene diene monomer (EPDM), or a polar rubber, such as nitrile butadiene rubber (NBR).

Instead of stretchable materials, flexible materials like polyimide can also be applied, resulting in a flexible circuit instead of a stretchable circuit.

Also material being both stretchable and flexible can be applied.

The patterned features can have a shape such that they are anchored into the stretchable or flexible material, which is a big advantage in flexible and especially stretchable electronics. Examples of shapes of the patterned features are given in FIG. 3. Anchoring of the features into the stretchable and/or flexible material is achieved in FIGS. 3.b, 3.d, 3.e, and 3.f. If not anchored, or taken care of by possibly other means, the features may come loose from the composite substrate. FIG. 3.c may have a lesser degree of adhesion, which may be solved by other means as for instance by choosing the right material combination—flexible and/or stretchable material and the patterned conducting layer material. Anchor structures may be provided in order to provide a good adhesion to the flexible and/or stretchable material film.

In certain embodiments according to the present invention, the patterned features have a substantially trapezoidal shape. An ideal trapezoidal shape has 2 sides of equal length, and a top side and a bottom side. In embodiments advantageous for adhesion, the top side is wider then the bottom side, such that flexible and/or stretchable material holds the features into place (see FIG. 3 b). In certain embodiments the patterned features have sloped sidewalls.

Trapezoidal shape or sloped sidewalls can be achieved by choosing the appropriate shape of the photoresist patterns after development. The developed photoresist preferably has sloped walls (number (1) in FIG. 1.a). This would result in conductors with trapezium-like cross sections (number (3) in FIGS. 1.b and 1.c), enhancing the mechanical stability of the conductors, even under stretch, because the conductors are "plugged" in the stretchable material (number (3) in FIG. 1.e). The sloped walls can easily be obtained using a positive photoresist. A suitable thick positive resist can be e.g. ma-P 1275 of Microresist (Berlin). However to obtain as fine pitches as possible, also resist patterning with vertical walls can be used. In this case the well known and widely used SU-8 negative resist from MicroChem is a suitable alternative for the positive resists.

Another way to obtain anchoring of the conductor uses an extra etch step after patterning the conductor. This is illustrated in FIG. 4. Patterning of the conductor is illustrated in FIGS. 4.a, 4.b, and 4.c. In the consequent etch step, the sacrificial layer is partially etched with underetch or undercut underneath the patterned conductor (see FIG. 4.d). When applying the stretchable and/or flexible material, this material will fill the gap underneath the patterned conductor (FIG. 4.e). When the sacrificial substrate is removed (FIG. 4.f), the patterned conductor is anchored into the stretchable and/or flexible material.

A combination of the two previous methods for anchoring the conductor, i.e. a combination of sloped sidewalls and extra etch step, results in even more reliable anchoring into the stretchable and/or flexible material.

The present embodiment can have advantages in the field of production of fine pitch flex substrates. For instance a pitch of 40 μm for a Cu thickness of 4 μm, equivalent to a resistivity of 5 mΩ/square, can be achieved.

It can be expected that using this process flow single metal layer stretchable circuits can be achieved in a quite straightforward way, with the attractive properties of high conductor pitch (target 40 μm=20 μm line/20 μm space) and potential for low cost reel-to-reel production.

The proposed process offers the possibility for reel-to-reel implementation, so that it is potentially a cost competitive process, especially compared to some prior art processes, some of which for instance start from a Si wafer as the base substrate. A lot of prior art processes cannot be done in a reel-to-reel environment.

Reel-to-reel (R2R) is term known by a person of ordinary skill. R2R is a process where the starting substrate (in our case the sacrificial layer) under the format of a long tape is wound off a first reel, then is sent through all processing machines, and at the end of the processing the resulting product (in this case the stretchable substrate with embedded conductors) is wound back onto a second reel. In a certain view, the whole system can be compared with a tape recorder.

Embodiments of the present invention have also some significant advantages, when it comes to embedding and assembly of components, e.g. ICs. An example of processing steps according this embodiment may be performed in the following order (see FIG. 5):

A flexible sacrificial layer or substrate is provided (number (2) in FIG. 5.a).

On this sacrificial layer, a patterned conducting layer or stack of conducting layers is provided. This patterned layer or stack of layers comprises patterned features (number (3) in FIG. 5.a).

At this stage, it is possible to bend the sacrificial substrate together with the patterned structures into a certain shape. This step is optional.

At this stage, also some extra components can be added (number (6) in FIG. 5.b).

If needed underfill of the components can be done (number (7) in FIG. 5.b).

Consequently, a stretchable and/or flexible material is provided on top of and in between the patterned features (number (4) in FIG. 5.c)

Eventually a local stiffener can be added to protect the extra components against excess mechanical stress during stretching (numbers (8) and (9) in FIG. 5.c).

Consequently, the sacrificial layer is removed (FIG. 5.d).

After removing the sacrificial layer, eventually a second set of components can be introduced at the side where the sacrificial layer is removed (number (6) in FIG. 5.e).

Optionally, this second set of components can be covered with the same or another stretchable and/or flexible material (number (10) in FIG. 5.f).

For contacting this second set of components, holes can be introduced into the latter stretchable and/or flexible material (FIG. 5.g).

In this approach for fabrication of stretchable composite substrates, a metal stack is grown by pattern plating on a conductive sacrificial metal layer (FIG. 5.a). Assembly of components at this stage of the substrate fabrication can be done, resulting in the situation illustrated in FIG. 5.b. Such component can be placed on top, typically in electrical but optionally in optical contact with the patterned features. These patterned features can form an interconnect section. This has the enormous advantage that assembly is done on flexible, but not yet stretchable substrates. In this way complex components like very thin flip-chips can be assembled.

In certain embodiments it can be necessary to apply an underfill material. The application of an underfill material may be advantageous in certain embodiments of the present invention, where the application of the stretchable and/or flexible material is not performing the underfill on itself. The underfill material is applied in substantially the whole area confined by the patterned features, the sacrificial layer and the respective component (number (7) in FIG. 5.b). In other words such underfill may be applied in between the components and the sacrificial layer on substantially the overlap area of both. Suitable underfill materials or adhesives have to be provided, which are not attacked during the removal etch of the sacrificial layer.

After mounting of the components the stretchable and/or flexible material is applied, thus embedding the assembled components (FIG. 5.c).

To protect the components against excess mechanical stress during stretching, application of local stiffeners (which might be flexible or even rigid) might be necessary. Components can be used for locally strengthening the flexible device, or for controlling the areas of higher and lower flexibility requirements (number (8) in FIG. 5.c). Such a component can be active or a passive. It can be rigid or flexible. Local limitation of substrate flexibility or stretchability can also be achieved by locally increasing the thickness of the applied flexible or stretchable material (number (9) in FIG. 5.c). This locally thicker substrate has the same function as the local stiffener (number (8) in FIG. 5.c). This local thickness increase can be achieved by using moulding techniques for the application of the flexible or stretchable materials, instead of curtain coating, dispensing, dipping or spincoating. These zones will deform less than the zones with thinner substrate material when the circuit is stretched, so the component connections will be subjected to smaller mechanical stresses.

Hereafter the sacrificial layer is removed (FIG. 5.d). Note that the whole process of interconnection substrate fabrication and component assembly is performed on a flexible non-stretchable carrier, and that stretchability in the composite substrate is introduced in the last step only, when removing the flexible sacrificial layer.

After removing the sacrificial substrate, it is possible to contact the circuit from the bottom side (e.g. if Au/Ni/Cu has been plated, standard contact metallization is available).

This makes it possible to assemble a second layer of components at this side of the substrate (number (6) in FIG. 5.e). In certain embodiments according to the present invention, a component can be placed on the composite substrate, typically in electrical but optionally in optical contact with the patterned features, on the side where the sacrificial layer was removed. It is clear however that now the assembly takes place on a stretchable circuit. Another layer of stretchable and/or flexible material can be applied on top of such component, for certain applications. After introducing a second layer of components at the backside of the substrate (where the sacrificial layer is removed), the backside of the substrate in turn can be covered with the same or another second stretchable and/or flexible material, thus giving the possibility to also embed components, mounted on this backside (FIG. 5.f).

In order to improve adhesion of this second layer of stretchable and/or flexible material, a surface treatment prior to depositing this second layer may be necessary. This surface treatment may comprise a plasma treatment of the surface where the sacrificial layer is removed.

In order to contact these components, holes need to be introduced into the second layer of flexible material (FIG. 5.g).

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of producing a composite substrate, comprising:
   providing a flexible sacrificial layer;
   producing one or more patterned conducting layers on the flexible sacrificial layer, the one or more patterned layers comprising a plurality of patterned features;
   providing a stretchable and/or flexible material on top of and in between the patterned features; and
   removing the sacrificial layer.

2. The method of producing a composite substrate according to claim 1, further comprising bending the sacrificial layer and the patterned features in a predetermined shape prior to providing the stretchable and/or flexible material.

3. The method of producing a composite substrate according to claim 1, wherein the patterned features comprise a shape such that the patterned features are anchored into the stretchable and/or flexible material.

4. The method of producing a composite substrate according to claim 1, wherein the patterned features comprise sloped sidewalls such that the patterned features are anchored into the stretchable and/or flexible material.

5. The method of producing a composite substrate according to claim 1 wherein the patterned features comprise a substantially trapezoidal shape.

6. The method of producing a composite substrate according to claim 1, further comprising:
   removing part of the sacrificial layer underneath the patterned features so as to create gaps underneath the patterned features, after the producing of one or more patterned conducting layers; and
   filling the gaps underneath the patterned features with the stretchable and/or flexible material such that the patterned features are anchored in the stretchable and/or flexible material.

7. The method of producing a composite substrate according to claim 1, wherein the patterned features are optically conducting or thermally conducting or electrically conducting.

8. The method of producing a composite substrate according to claim 1, wherein the patterned features comprise a metal or a semiconductor material.

9. The method of producing a composite substrate according to claim 1, wherein the sacrificial layer comprises a plurality of sub-layers.

10. The method of producing a composite substrate according to claim 9, wherein the at least one sacrificial sub-layer and the sacrificial layers are peeled off the patterned features and the stretchable and/or flexible material together.

11. The method of producing a composite substrate according to claim 9, wherein sacrificial sub-layers are etched off selectively with respect to the next sub-layer.

12. The method of producing a composite substrate according to claim 1, wherein the sacrificial layer is conducting.

13. The method of producing a composite substrate according to claim 12, wherein the producing comprises:
   applying a resist layer;

patterning the resist layer;
electroplating one or more conducting layers; and
removing the resist layer.

14. The method of producing a composite substrate according to claim 1, wherein providing the stretchable and/or flexible material is achieved with one of the following techniques: moulding, curtain coating, dispensing, dipping, and spincoating.

15. The method of producing a composite substrate according to claim 1, further comprising providing components into the composite substrate, the components being in electrical or optical contact with the patterned features.

16. The method of producing a composite substrate according to claim 15, wherein the patterned features form an interconnect section between the components.

17. The method of producing a composite substrate according to claim 15, further comprising applying an underfill material in substantially the whole area confined by the patterned features, the sacrificial layer and the components.

18. The method of producing a composite substrate according to claim 15, wherein the components are provided at the side where the sacrificial layer is removed.

19. The method of producing a composite substrate according to claim 18, further comprising providing a second layer of stretchable and/or flexible material surrounding the components.

20. The method of producing a composite substrate according to claim 19, further comprising performing a surface treatment prior to providing the second layer of stretchable and/or flexible material.

21. The method of producing a composite substrate according to claim 20, wherein the surface treatment is a plasma treatment.

22. The method of producing a composite substrate according to claim 20, further comprising patterning the second layer of stretchable and/or flexible material.

23. The method of producing a composite substrate according to claim 1, further comprising providing a local stiffener.

24. The method of producing a composite substrate according to claim 23, wherein the local stiffener is rigid or flexible.

25. The method of producing a composite substrate according to claim 23, wherein the local stiffener is provided by locally increasing the thickness of the stretchable and/or flexible material.

26. The method of producing a composite substrate according to claim 25, wherein the locally increasing of the thickness is achieved by moulding techniques.

27. The method of claim 1, wherein the providing of a stretchable and/or flexible material on top of and in between the patterned features comprises providing a stretchable and/or flexible material to cover substantially all the top surface and sidewall of the patterned features.

28. The method of claim 1, wherein the stretchable and/or flexible material comprises at least one of the following: silicone, latex, polyurethane, rubber, thermoplastic elestomers (TPE), and polyimide.

29. A method of producing a composite substrate, comprising:
    providing a sacrificial layer;
    providing a patterned resist layer on the flexible sacrificial layer;
    depositing a conducting layer in between the patterned resist layer such that the conducting layer is also patterned;
    removing the resist layer;
    providing a stretchable and/or flexible material on top of and between patterned features of the conducting layer; and
    removing the sacrificial layer.

* * * * *